(12) United States Patent
Schmitt

(10) Patent No.: US 8,399,367 B2
(45) Date of Patent: Mar. 19, 2013

(54) PROCESS FOR HIGH-PRESSURE NITROGEN ANNEALING OF METAL NITRIDES

(75) Inventor: Jason Schmitt, Wichita, KS (US)

(73) Assignee: Nitride Solutions, Inc., Wichita, KS (US)

( * ) Notice: Subject to any disclaimer, the term of this patent is extended or adjusted under 35 U.S.C. 154(b) by 64 days.

(21) Appl. No.: 13/171,042

(22) Filed: Jun. 28, 2011

(65) Prior Publication Data
US 2013/0005117 A1 Jan. 3, 2013

(51) Int. Cl.
*H01L 21/00* (2006.01)
(52) U.S. Cl. ............... 438/796; 438/604; 257/E21.326
(58) Field of Classification Search ............ 438/378, 438/590, 607, 774; 257/E21.317, E21.322, 257/E21.326, E21.398, E21.405, E21.497
See application file for complete search history.

(56) References Cited

U.S. PATENT DOCUMENTS

| | | | |
|---|---|---|---|
| 5,786,233 A | 7/1998 | Taskar et al. | |
| 7,081,401 B2 | 7/2006 | Lee et al. | |
| 7,175,704 B2 | 2/2007 | Develyn et al. | |
| 7,261,775 B2 * | 8/2007 | Iwata et al. | 117/81 |
| 2004/0231582 A1 | 11/2004 | Foise et al. | |
| 2007/0190758 A1 | 8/2007 | Kaeding et al. | |

OTHER PUBLICATIONS

Porowski, S et al, Annealing of GaN under high pressure of nitrogen, 2002, J. Phsy.: Condens. Matter, pp. 11097-11110, vol. 14.
International Search Report and Written Opinion regarding PCT/US2012/044690 issued Sep. 12, 2012, 12 pages.

* cited by examiner

*Primary Examiner* — Cheung Lee
(74) *Attorney, Agent, or Firm* — Polsinelli Shughart PC

(57) ABSTRACT

The disclosure provides a process to anneal group III-V metal nitride crystals, wafers, epitaxial layers, and epitaxial films to reduce nitrogen vacancies. In particular, the disclosure provides a process to perform slow annealing of the group III-V metal nitrides in a high temperature and high pressure environment.

19 Claims, 3 Drawing Sheets

PROCESS FOR HIGH-PRESSURE NITROGEN ANNEALING OF METAL NITRIDES

FIELD OF THE INVENTION

The present disclosure relates to a process for reducing nitrogen vacancies in metal nitrides. In particular, the present disclosure relates to a slow annealing process used to reduce nitrogen vacancies in bulk crystals, wafers, epitaxial layers, and epitaxial films of metal nitride compounds by post-growth annealing in a high temperature and high pressure environment, resulting in metal nitrides having a reduced nitrogen vacancy density and improved p-type conductivity.

BACKGROUND

Metal nitride epitaxial layers and films are the basis of many modern electronic devices such as light emitting diodes (LEDs) and power transistors. A nitrogen vacancy (VN) is a point defect affecting chemical bonds between atoms within metal nitrides and is formed by a lack of nitrogen during the production and growth of the metal nitrides. The defects have been shown to be a significant contributor to poor positive (p-type) conductivity in metal nitride compositions, including those used as semiconductors. Typically, nitrogen vacancies have the lowest formation energy in semiconductor materials and may act as single or triple electron donors ($VN_{1+}$) and ($VN_{3+}$), respectively. Poor p-type conductivity results in high internal resistance and limits the efficiency and performance of metal nitride semiconductor materials. Therefore, there is a desire to improve p-type conductivity of metal nitride semiconductor materials by reducing nitrogen vacancies ($VN_{1+}$ and/or $VN_{3+}$).

It is known that nitrogen vacancies are easily generated in metal nitrides due to the high vapor pressure of nitrogen, and the low efficiency in disassembling $NH_3$. Metal nitrides are often unintentionally doped with nitrogen vacancies during the growth process. As a result, the quality of the grown compositions is diminished, since nitrogen vacancies affect the electrical and optical properties of the metal nitrides. The nitrogen vacancies contribute to the negative (n-type) conductivity of the metal nitrides. N-type conductivity refers to the conductivity associated with donor electrons in a semiconductor, which are functionally equivalent to negative charges.

Efforts to reduce the dominance of n-type conductivity have included doping the materials to increase the p-type conductivity of the material. More specifically, p-type doping agents are incorporated into the metal nitrides in an attempt to counteract or "neutralize" the effect of growth impurities and/or defects, including nitrogen vacancies. P-type doping, however, also generates nitrogen vacancies ($VN_{1+}$ and/or $VN_{3+}$) through a self-compensating mechanism.

Nitrogen vacancies are extremely mobile within the lattice structure of metal nitrides. Therefore, it is possible to reduce the density of nitrogen vacancies in the metal nitrides through an annealing process, which diffuses nitrogen atoms into the metal nitride lattice and pushes nitrogen vacancies out of the lattice. High-temperature annealing has shown promise in improving the crystalline structure and electrical conductivity qualities of metal nitrides. Some materials including group III-V metal nitrides (e.g. aluminum nitride, gallium nitride, and indium nitride), however, will decompose under rapid thermal annealing where the pressures range from a vacuum to approximately atmospheric pressure. Thus, there exists a need for a slow high temperature and high pressure (HTHP) annealing process that can be monitored and adjusted is needed to ensure that crystal relaxation and void movement occur without significant nitrogen decomposition.

SUMMARY

The present disclosure relates to a slow, post-growth process for forming metal nitrides having increased p-type conductivity. In one aspect, the process includes placing a post-growth metal nitride in an annealing apparatus that includes an annealing vessel. Ambient gases are then evacuated from the annealing vessel to produce a vacuum within the annealing vessel. An overpressure of nitrogen gas, greater than approximately atmospheric pressure, is created within the annealing vessel. The annealing vessel is typically heated to a temperature sufficient to diffuse the nitrogen species into the metal nitride. The metal nitrides are then annealed for an hour or more to reduce the nitrogen vacancy density within the material. Typically the metal nitride is annealed for a period between one and one hundred hours, at a temperature ranging from 600° C.-2900° C., and at a pressure greater than 760 torr (~1 standard atmosphere (ATM)). Critically, the process uses heat and overpressure for a period of time to produce a metal nitride with increased p-type conductivity.

In one aspect, a metal nitride is annealed for a period between one and forty-eight hours, at a temperature ranging from 1000° C.-2400° C., and at a pressure ranging from 3800 torr to 10100 torr. Therefore, the resultant metal nitride is distinguishable by the reduced density of nitrogen vacancies and improved p-type conductivity as evidenced by a resistivity between approximately 0.0001 Ohm-cm to approximately 100 Ohm-cm.

In another aspect, a group III-V metal nitride is annealed for a period of at least twenty-four hours, at a temperature of 2200° C., and a pressure of 7000 torr. The resultant group III-V metal nitride has a decreased concentration of nitrogen vacancies and improved p-type conductivity as evidenced by a resistivity of about 0.0001 Ohm-cm to about 100 Ohm-cm. The precise decrease in nitrogen vacancy concentration and improvement in p-type conductivity is dependent upon the metal nitride annealed, the level of p-type doping, and the p-type dopant used.

The annealing process may be carried out by an annealing apparatus. The annealing apparatus includes an annealing vessel that has a housing to define an interior void for receiving post-growth group III-V metal nitrides. The annealing apparatus also includes a heating system for maintaining a desired temperature within the annealing vessel and a nitrogen gas source to provide a nitrogen species to the annealing vessel. The apparatus further includes a vacuum system to create a near vacuum for purging the ambient gas from within the annealing vessel and a pressure control system to provide a constant overpressure of the nitrogen species to the annealing vessel. The annealing apparatus also includes a feedback control system to monitor and control the various systems of the annealing apparatus.

DETAILED DESCRIPTION

Figure 1:
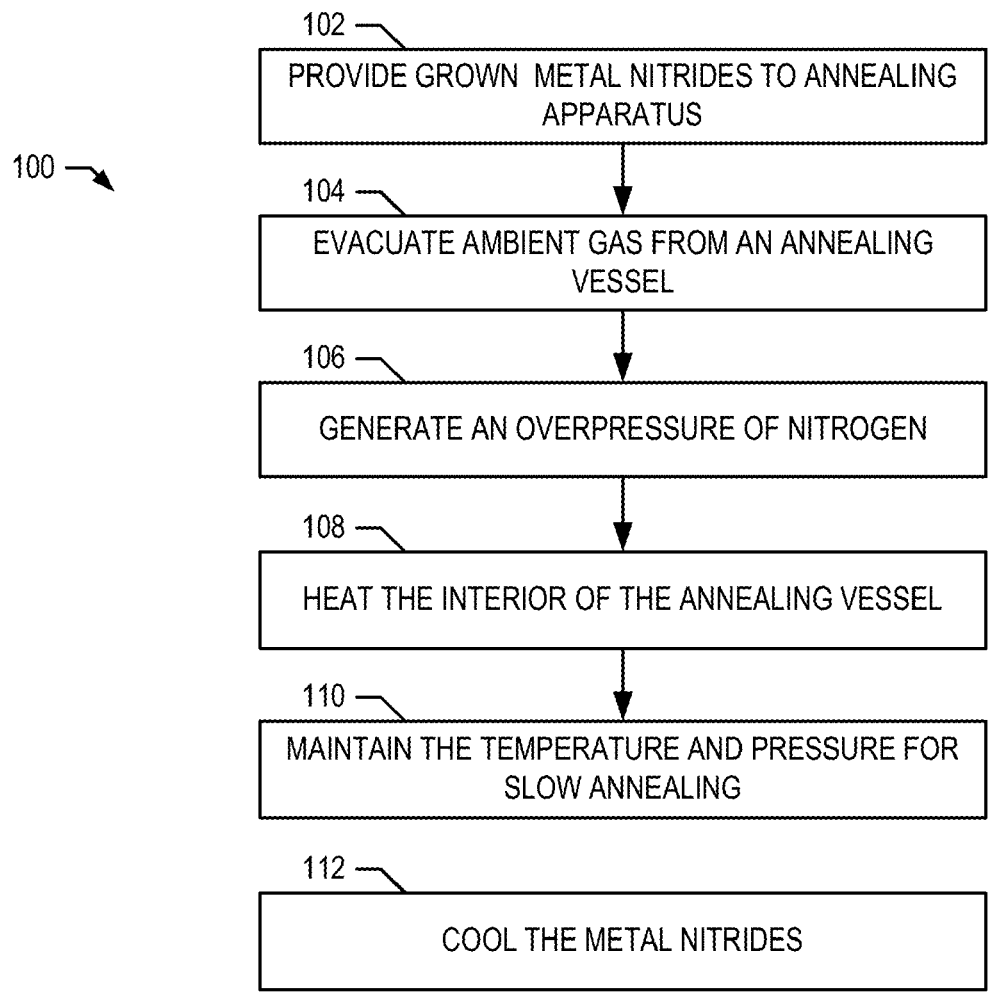
FIG. 1 is a flow chart of a slow annealing process in accordance with an embodiment of the present disclosure.

The process of the present disclosure provides a slow method to improve p-type conductivity in metal nitrides. Metal nitrides as used herein, refer to metal nitride crystals, wafers, epitaxial layers or films, or other compositions consisting essentially of a metal nitride compound. Slow as used herein, refers to a duration of time greater than one-half hour. The method includes heating the metal nitrides, including substrates or epitaxial layers grown on substrates, for at least one hour in a nitrogen rich environment at a pressure greater than atmospheric pressure.

The slow high-temperature and high-pressure (HTHP) annealing process promotes nitrogen diffusion into boules, wafers, epitaxial layers, and/or epitaxial films, thus producing metal nitrides containing a decreased concentration of nitrogen vacancies. The diffusion of nitrogen into the metal nitrides effectively increases the concentration of the nitrogen species within the metal nitrides. The increased concentration of the nitrogen species increases the stoichiometric ratio of nitrogen atoms within the nitrides. Therefore, the reduction in nitrogen vacancies improves the p-type conductivity by reducing the effects of hole trapping caused by the vacancies, voids, and other imperfections in the metal nitrides.

The slow annealing process improves the positive (p-type) conductivity of doped metal nitrides, typically used in the manufacture of semiconductors. Slow annealing has been particularly useful in improving the p-type conductivity of binary, ternary, and quaternary group III-V metal nitrides, including those of the form AXB1-XN where A and/or B are group III-V elements, such as but not limited to B, Al, Ga, or In. Following the slow annealing process, the metal nitrides will have improved p-type conductivity as evidenced by a decreased resistivity ranging between approximately 0.0001 to 100 Ohm-cm, depending upon the metal nitride annealed, the level of doping, and the dopant used.

P-type conductivity refers to the conductivity associated with holes in semiconductor materials. In semiconductor material, a hole refers to a vacant orbital in an otherwise filled electron shell of an atom. In applied electric and/or magnetic fields, a hole behaves as a positive charge e+. A hole may be generated by doping. For example, the substitution of a group III metal atom in the metal nitride, (e.g. Al) with an atom having less than three electrons in its outermost shell, (e.g. Mg or Ca) creates holes in the material.

Vacancies are identified by one or more atoms absent from the lattice structure of the material. Similarly, a void is a cluster of two or more vacancies. Vacancies contain extra unbound electrons. Therefore, to counteract the vacancies a p-type dopant atom having less than three electrons in the outermost shell must be incorporated into the metal nitride for each nitrogen vacancy.

P-type semiconductor materials are typically produced by a process of doping that adds certain types of atoms to the semiconductor material in order to increase the number of free charge carriers. As the doping agent is added, it accepts weakly-bound outer electrons from atoms of the semiconductor material. The electron vacancy left behind by the electron is a hole.

P-type doping is performed to create an abundance of holes and therefore increase the number of functional positive charges. For example, when magnesium and/or beryllium are used as doping agents, at least one electron is removed from the four covalent bonds normally found in a group III-V metal nitride lattice. Thus, the dopant agent can accept an electron from a neighboring atom's covalent bond thereby forming a hole that functions as positive point charge. When a sufficiently large quantity of the doping agent atoms is added, the holes greatly outnumber the electrons. Thus, the holes become majority carriers, while electrons become minority carriers in p-type doped semiconductor materials.

Under slow HTHP annealing, nitrogen atoms can diffuse back into metal nitrides, including p-type doped metal nitrides, thereby reducing nitrogen vacancies, repairing the crystal structure, and increasing the p-type electrical properties of the metal nitrides.

By way of example and not limitation, AlN substrates have been shown to exhibit rapid diffusion rates for nitrogen vacancies into and out of its lattice structure. The average 1-D diffusion length is as high as 1 cm/hr at 2200° C. Such high diffusion constants are orders of magnitude greater than the diffusion lengths of commonly used p-type dopant atoms (Mg, Be, Si, etc.). Therefore, nitrogen vacancies can be diffused out of the AlN substrate while retaining the p-type dopant atoms.

The p-type conductivity of a metal nitride boule and/or wafers cut from a boule may be improved by the slow HTHP annealing process prior to and/or after polishing. The conductivity of cut wafers having one or more epitaxial layers of one or more metal nitrides deposited thereon is also improved by the slow high temperature and high-pressure annealing process. The annealing process may be carried out after the growth of each epitaxial layer and/or selective epitaxial layers. The annealing process may also be carried out once all the epitaxial layers have been grown. Although the annealing process is described using boules, wafers, and/or epitaxial layers of metal nitrides, the process may also be carried out on epitaxial films consisting essentially of a metal nitride compound.

Although the HTHP annealing process, can be used on all metal nitrides, the process is described in reference to group III-V metal nitrides including, but not limited to, aluminum nitride (AlN) and aluminum gallium nitride (AlGaN). Other group III-V elements may be used. The process also promotes the relaxation of the crystal lattice of metal nitrides to improve the crystalline structure of the metal nitrides, as well as repairing damage to wafer surfaces after sawing and/or polishing.

FIG. 1 is a flow diagram of a slow post-growth high temperature and high pressure annealing process 100. The annealing process 100 is performed on metal nitrides, including boules, wafers, and epitaxial layers and films of the metal nitrides grown on a variety of substrates. The annealing process 100 includes heating the metal nitrides to a desired temperature in a high-pressure nitrogen-rich environment and maintaining the desired temperature for at least one hour to cause the nitrogen vacancies to diffuse out of the metal nitrides. The metal nitrides are placed in an annealing apparatus having one or more components and systems, including but not limited to a vacuum system, a heater system, a pressure control system, a gas source, and a feedback monitoring system. The annealing apparatus controls the parameters and other variables of the annealing process 100 that is performed over a number of steps 102-110.

Figure 2:
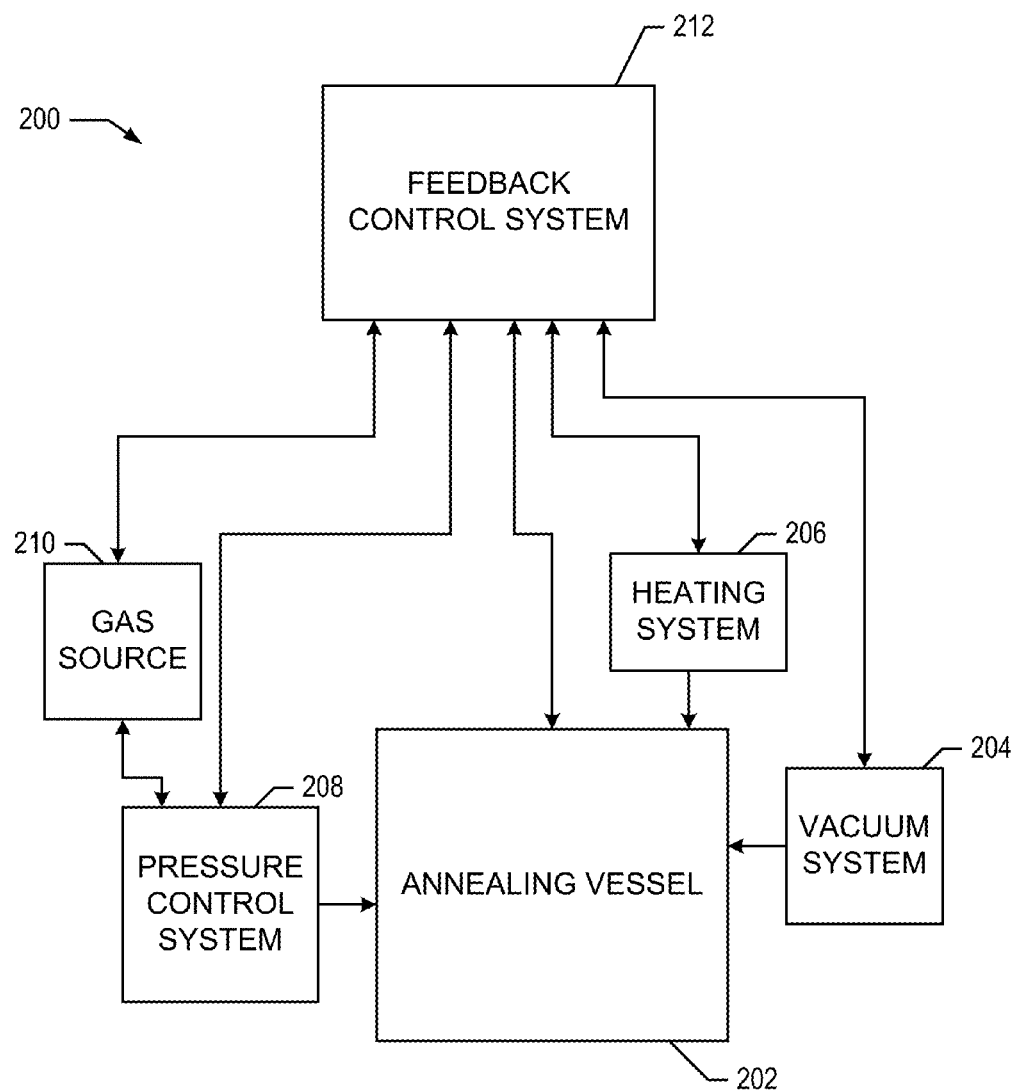
FIG. 2 is a block-diagram depicting an annealing apparatus for performing the slow annealing process in accordance with an embodiment of the present disclosure.

At step 102, one or more group III-V metal nitrides are placed in an annealing apparatus, such as the annealing apparatus 200 as shown in FIG. 2. In one aspect, the annealing process 100 is performed post-growth on group III-V metal nitrides grown in a vessel of the annealing apparatus. In another aspect, the annealing process 100 is performed on group III-V metal nitrides grown in another reactor or growth device and subsequently placed in an annealing vessel of the annealing apparatus. As such, the group III-V metal nitrides may be annealed to reduce nitrogen vacancies (VN3+) and (VN1+) that formed during growth and thereby increase the p-type conductivity concentration of the semiconductor materials regardless of how grown or manufactured.

The annealing vessel is evacuated, at step 104. A vacuum system evacuates the annealing vessel to create a high vacuum in the interior of the annealing vessel and purge the annealing vessel of ambient gas. The high vacuum can range from below ambient atmospheric pressure to a near perfect vacuum. In one aspect, the annealing vessel is depressurized to create a high vacuum ranging from $1\times10^{-5}$ to $1\times10^{-9}$ torr.

Next, a nitrogen species is injected at step 106 as a gas. A high pressure pump is used to create an overpressure of the nitrogen gas in the annealing vessel. The inert nitrogen species further purges the interior of the annealing vessel and diffuses into and out of the surface of the group III-V metal nitrides to replace nitrogen vacancies that formed during the growth of the metal nitrides. The gas may be composed entirely of a nitrogen species or a mixture of the nitrogen species and one or more other species. In one example, the overpressure of nitrogen gas may range from about 760 torr to about $3.8\times10^8$ torr. In another example, the overpressure of nitrogen gas ranges from about 3800 to about 10100 torr.

In one aspect, the high pressure pump generates the overpressure of the nitrogen gas by injecting the gas at a pressure within a desired pressure range. In another aspect, the nitrogen gas is injected into the interior of the annealing vessel at a lower than desired pressure. The pressure of the nitrogen gas is then increased to the desired range by heating the interior of the annealing vessel.

The interior of the annealing vessel is then heated, as shown at step 108. In one aspect, the interior of the annealing vessel is heated to a temperature ranging from 1000° C.-2500° C. In another aspect, the metal nitrides are annealed at approximately 2000° C.

The temperature and pressure within the annealing vessel are maintained at the desired ranges to anneal the metal nitrides for at least one hour, at step 110. In one aspect, the metal nitrides are annealed for between about one to about one hundred hours, which is long enough to allow the N2 gas to diffuse into and out of the surface of the metal nitrides and reduce the number of nitrogen vacancies and/or other imperfections. In another aspect, the metal nitrides are annealed for approximately twenty-four hours. The precise pressure and duration for the annealing process are dependent on the size and type of metal nitride being annealed.

The metal nitrides are allowed to cool at step 112. In one aspect, the metal nitrides are removed from the annealing vessel and cooled at an ambient environment. In another aspect, the metal nitrides are cooled in a controlled manner within the annealing vessel. In this aspect, the temperature and/or pressure within the annealing vessel is varied to control the cooling of the metal nitrides. For example, the metal nitrides may be slowly cooled over an extended period of time to minimize any thermal displacement of the metal nitrides. Thermal displacement, as used herein, refers to the contraction and/or expansion of the metal nitrides as a result of heating and/or cooling.

FIG. 2 is a block diagram of an annealing apparatus 200 that may be used to perform one or more aspects of the slow annealing process 100 (see FIG. 1). In one aspect, the annealing apparatus 200 includes an annealing vessel 202, a vacuum system 204, a heating system 206, a pressure control system 208, a nitrogen gas system 210, and a feedback control system 212.

The Annealing Vessel

The annealing vessel 202 is a closed vessel wherein one embodiment of the slow annealing process 100 is carried out.

In one aspect, the annealing vessel 202 includes a housing suitable to withstand high temperatures and high pressures. For example, the annealing vessel may be a high-pressure autoclave. The annealing vessel 202 may also be a reactor, such as a crystal growth reactor, that is configured to withstand high temperatures and high pressures.

In one aspect, the annealing vessel 202 is insulated to protect the environment surrounding the annealing vessel from thermal damage due to the high temperatures at which the annealing process takes place. The annealing vessel 202 is constructed to maintain structural integrity at a wide range of internal pressures ranging from about $1\times10^{-9}$ torr to about $3.8\times10^8$ torr and temperatures up to about 2900° C. that may occur during the post-growth annealing process 100.

In another aspect, the annealing vessel 202 is able to receive a number of wafers and/or boules into the interior of the annealing vessel. For example, the annealing vessel 202 may accommodate 1-5000 wafers and/or 1-100 bulk crystals. In other examples, the annealing vessel 202 may accommodate any number of wafers and/or boules as limited by the size of the annealing vessel.

The annealing vessel 202 is also of sufficient size to receive a structure for supporting the boule and/or wafers. In one example, wafers may be placed in a quartz wafer boat, such as the boat 308 shown in FIG. 3, prior to being placed in the annealing vessel 200. In other examples, the boules and/or wafers may also be placed into or held by other structures suitable to withstand the pressures and temperatures within the annealing vessel 202. By way of example and not limitation, the other structures may be composed of titanium diboride (TiB2), aluminum nitride ceramics, refractory metals, metal carbides, and/or other metal nitrides.

In one aspect, the boules and/or wafers are placed within the supporting structures prior to being placed in the annealing vessel 202. In another aspect, the supporting structures remain in the annealing vessel 202 and the group III-V metal nitrides to be annealed are loaded into the supporting structures.

The annealing vessel 202 may configured in any suitable orientation including a horizontal orientation, a vertical orientation, a 45° orientation relative to a vertical reference, and any intermediate orientation depending on the desired use and location of the annealing apparatus 200.

The Vacuum System

The vacuum system 204 removes ambient gases from the annealing vessel 202 prior to annealing the group III-V metal nitrides placed therein. In one aspect, the vacuum system 204 may be any pumping system capable of producing a high vacuum. A high vacuum, as used herein, means a pressure of approximately $1\times10^{-5}$ to $1\times10^{-9}$ torr.

In another aspect, the vacuum system 204 produces the high vacuum through a two-stage pumping process. The process includes a first stage that reduces the base pressure of the annealing vessel 202 to $\sim1\times10^{-4}$ torr. The first stage may be achieved by a mechanical vacuum pump. Other vacuum pumps may be used.

In one aspect, where the annealing vessel 202 was used as a growth reactor for boules and/or epitaxial layers on substrates, the first stage of the vacuum system 204 may include a butterfly valve to reach and maintain pressures suitable for crystal growth. Once the crystal growth is complete, the second stage of the vacuum system 204 may be used to produce the high vacuum prior to the post-growth annealing of the grown crystals and/or epitaxial layers.

The second stage of the vacuum system 204 reduces the base pressure of the annealing vessel 202 to $\sim1\times10^{-9}$ torr. The second stage may include a turbomolecular pump and/or a diffusion pump. Other pumps capable of producing a high vacuum may be used.

The Heating System

The heating system 206 provides and maintains a high temperature within the annealing vessel 202 for annealing the post-growth group III-V metal nitrides. Any process of generating heat may be used within the heating system 206. By way of example and not limitation, the heating system 206 may heat the annealing vessel 202 by the induction heating of a graphite component within the annealing vessel, resistive heating, and/or focused microwave heating. Other heating systems or devices may be used.

In one embodiment, the heating system 206 includes a radio frequency induction heater. The radio frequency induction heater further includes a susceptor constructed from a single piece of a refractory material. For example, the susceptor may be composed of graphite. Other refractory materials suitable for use in the heating system 206 include tantalum carbide, zirconium carbide, zirconium nitride, and zirconium boride. In other aspects, suitable refractory materials also have good thermal conductivity and/or susceptibility to inductive heating.

In one aspect, the heating system 206 is capable of producing and maintaining a temperature within the annealing vessel 202 of at least 600° C. In another aspect, the temperature of the annealing vessel 202 is maintained at a temperature ranging from 600° C.-2900° C. In another aspect, the temperature within the annealing vessel 202 is maintained between 1000° C.-2200° C. during the annealing process 100.

The Pressure Control System

The pressure control system 208 provides an overpressure of nitrogen gas to the annealing vessel 202 after the annealing vessel is evacuated by the vacuum system 204. In one aspect, the pressure control system 208 may include one or more gas supply tubes connected to the annealing vessel 202 and the nitrogen gas system 210. The pressure control system 208 may further include a manual or electrically controllable pressure valve to control the rate of flow of nitrogen gases into the annealing vessel 202. The pressure control system 208 may also include another manual or electrically controllable pressure valve to bleed the nitrogen gas from the annealing vessel 202 to maintain the desired overpressure. The gas supply tubes and pressure valves may be constructed of any suitable material.

In one embodiment, the pressure control system 208 is capable of delivering the nitrogen gas at a pressure ranging from about 760 torr to about 3.8×108 torr. The pressure control system 208 also provides and maintains an overpressure of nitrogen gas equal to or greater than 3800 torr and preferably in the pressure range of 3800-10100 torr. In another embodiment, the gas is delivered at a lower pressure, such that the pressure of the nitrogen gas is increased due to the heating of the annealing vessel 202.

The Nitrogen Gas System

The nitrogen gas system 210 supplies the nitrogen gas that is delivered to the annealing vessel 202 via the pressure control system 208. By way of example and not limitation, the gas source system 208 may include a nitrogen gas generator capable of isolating nitrogen from the ambient air, a tank or cylinder of compressed nitrogen gas, and/or any suitable system to convert stored liquid nitrogen to nitrogen gas.

In one embodiment, the nitrogen gas system 210 and the pressure control system 208 may be integrated into a single system. The single integrated system therefore provides and controls the overpressure of nitrogen gas to the annealing vessel 202.

The Feedback Control System

The feedback control system 212 monitors and interacts with the other systems 204-210 of the annealing apparatus 200. The feedback control system 212 includes one or more sensors that monitor one or more measurable parameters within the annealing vessel 202. By way of example and not limitation, the parameters include temperature, pressure, nitrogen gas flow rate, heating duration, and annealing duration. Any suitable sensors may be used to monitor the parameters of the HTHP annealing process 100, including but not limited to thermocouples, pyrometers, thermistors, and piezoelectric pressure sensors.

In one embodiment, the feedback control system 212 includes one or more computing devices having a processor and memory. In this aspect, a signal produced by one or more sensors may be received and monitored at the processor of the feedback control system 212. In response to the signal received from the sensors, the computing device may generate one or more commands to the systems 204-210 of the annealing apparatus 200 in order to alter a parameter of the annealing process 100. The interactions between the feedback control system 212 and the other components of the annealing apparatus 200 may be based on any suitable control scheme, including but not limited to linear or non-linear control strategies.

The commands generated by the feedback control system 212 may alter or conversely, maintain one or more parameters of the annealing process 100. For example, the feedback control system 212 may generate a command for the induction heater of the heating system 206 to reduce the voltage of an applied electric field in response to an increase in the temperature within the annealing vessel 202 that is outside of a desired temperature range. By way of example and not limitation, the parameters that may be modified include the nitrogen gas overpressure provided by the pressure control system 208, the flow rate of the nitrogen gas from the gas source 210, and the temperature within the annealing vessel 202, and the vacuum pressure in the annealing vessel prior to the annealing the group III-V metal nitrides.

In one embodiment, the feedback control system 212 receives a number of signals from a number of locations within the annealing vessel 212. For example, the feedback control system 212 may obtain a number of temperature readings from a number of locations within the annealing vessel 202 in order to ensure that the temperature is uniform throughout the annealing vessel. In another example, the feedback control system 212 may be used to create a temperature gradient within the annealing vessel 202. In another aspect, the signals and commands may be transmitted and received by the feedback control system 212, sensors and the other systems 204-210 of the annealing apparatus 200 via wired and/or wireless communication.

In another embodiment, the feedback control system 212 may be used to automate and control the post-growth annealing process 100. For example, the feedback control system 212 may automatically control the ramping time of the heating system 206, the soak time of the annealing process 100 and the cool down time for the annealing vessel 202 and the group III-V metal nitrides therein, following the annealing process based upon instructions received at the feedback control system 212. The instructions may be provided manually by an operator of the annealing apparatus 200 or by a software program executing on the feedback control system 212 or another computing device in communication with the feedback control system.

Figure 3:
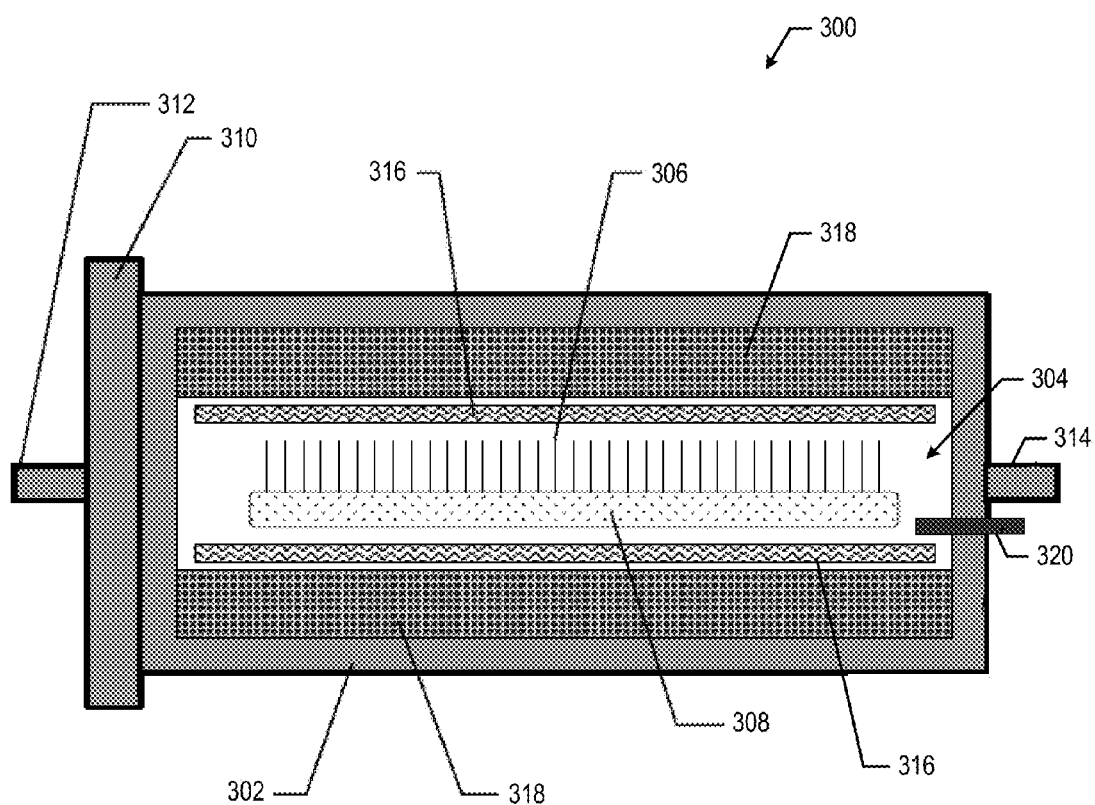
FIG. 3 is a block diagram of an annealing vessel used in the slow annealing process in accordance with an embodiment of the present disclosure.

FIG. 3 is a block diagram of an embodiment of the annealing vessel, generally indicated as 300. In one embodiment, the annealing vessel 300 is not used to grow boules and or epitaxial layers on substrates. In this aspect, the annealing vessel 300 is used to anneal group III-V metal nitrides grown or prepared in a separate reactor. The annealing vessel 300 includes a housing 302 that defines an interior void 304. The interior void 304 is suitable to receive a number or substantial volume of group III-V metal nitrides. For example, the interior void 304 can accommodate a number of wafers 306 that have been loaded into a wafer boat 308. In this example, the wafers 306 are loaded into the wafer boat 308 prior to inserting the boat into the housing 302.

After the wafer boat 308 is placed into the housing 302, the annealing vessel is sealed using a housing lid 310. The housing lid 310 may be constructed from the same material as the housing 302 or any other material suitable to maintain structural integrity at pressures ranging from about $1\times10^{-9}$ torr to about $3.8\times10^8$ torr and temperatures up to about 2900° C. The housing lid 310 may include one or more sealing elements (not shown) to provide a thermal, fluid, and/or high pressure seal isolating the interior void 304 from the external environment. The housing lid 310 may be removably attached to the annealing vessel using any process or apparatus that is sufficient to withstand the temperature and pressure ranges experienced within the housing 302. By way of example and not limitation, the housing lid 310 may be affixed by threaded male or female fittings, a bayonet mount, or threaded bolts. Other fastening methods or devices may be used.

The annealing vessel 300 also incorporates a gas outlet 312. The gas outlet 312 is used to purge ambient gases from the interior void 304 of the annealing vessel 300. The gas outlet 312 also provides a means to create the high vacuum within the interior void 304. In one aspect, the gas outlet 312 includes tubing and/or other piping of suitable construction. One end of the gas outlet 312 is in fluid communication with the interior void 304 of the annealing vessel 300, while another end of the gas outlet is in fluid communication with a vacuum system, such as the vacuum system 204 (see FIG. 2). The vacuum system 204 produces the high vacuum within the interior void 304 via the gas outlet 312. The gas outlet 312 may also include one or more manual or electrically-controllable pressure valves to regulate and/or seal the gas outlet.

In one aspect, the gas outlet 312 communicates with the interior void 304 of the annealing vessel 302 through one or more openings in the annealing vessel lid 310. In this aspect, the gas outlet 312 may be incorporated into the construction of the annealing vessel lid 310.

In one aspect, the gas outlet 312 communicates with the interior void 304 of the annealing vessel 302 through one or more openings in the housing 302. In this aspect, the gas outlet 312 may be incorporated into the construction of the housing 302.

The annealing vessel 300 also incorporates a gas inlet 314. The gas inlet 314 is used to provide nitrogen gas to the interior void 304. In one aspect, the gas inlet 314 includes tubing and/or other piping of suitable construction. One end of the gas inlet 314 is in fluid communication with the interior void 304, while another end of the gas inlet is in fluid communication with a pressure control system, such as the pressure control system 208. The pressure control system 208 produces an overpressure of nitrogen gas by injecting nitrogen gas into the interior void 304. The gas outlet 312 may also include one or more manual or electrically controllable pressure valves to regulate and/or seal the gas outlet 312.

The nitrogen gas may be injected into the interior void 304 at a pressure ranging from about 760 torr to about $3.8\times10^8$ torr. Alternately, the nitrogen gas is injected at a lower pressure and then subsequently heated to increase the nitrogen gas to the desired pressure range.

In one aspect, the gas inlet 314 communicates with the interior void 304 of the annealing vessel 302 through one or more openings in the housing 302. In this aspect, the gas inlet 314 may be incorporated into the construction of the housing 302.

The interior void 304 of the annealing vessel 302 is heated by a resistive heater 316 to a temperature ranging from 600° C.-2900° C. The resistive heater 316 may include any resistance heating element known in the art that is suitable for producing the desired temperature and capable of withstanding the pressure ranges provided to the interior void 304.

In one aspect, the resistive heater 316 is composed of a refractory material. Suitable refractory materials have little to no chemical reactivity with the nitrogen gas injected into the annealing vessel 300. In addition, suitable refractory materials have good thermal conductivity and/or susceptibility to inductive heating. By way of example and not limitation, refractory materials suitable for use in the resistive heater 316 include tungsten, tungsten carbide, tantalum, tantalum carbide, zirconium, zirconium carbide, zirconium nitride, zirconium boride, molybdenum, niobium, and alloys thereof.

In one aspect, the resistive heater 316 is configured as a coil or cylinder that encompasses the interior void 304. Alternately, the resistive heater 316 may include one or more contiguous or separated segments disposed along the interior surface of the housing 302. The segments of the resistive heater may be monitored and controlled by an external system, such as the heating system 206 or the feedback control system 212. In one aspect, the temperature within the housing 302 is maintained with the aid of foam graphite or refractory metal insulation 318.

The housing 302 and/or the housing lid 310 may incorporate one or openings as a feedback port 320. The feedback port 320 allows for communication between a thermocouple and/or other monitoring sensor located the interior void 304 and the feedback system 212 and/or other components of the annealing apparatus 200 to monitor and control various parameters for the annealing process 100 within the annealing vessel 300. In one aspect, the feedback port 320 includes a seal and a wire harness or other electrical connector to allow wired communication between one or more sensors within to annealing vessel 300 and the feedback system 212. In another aspect, the feedback port 320 includes a transmitter to transmit wireless communications to the feedback system 212 and/or other components of the annealing apparatus 200.

In one aspect, the slow HTHP annealing process diffuses the nitrogen species into the metal nitrides at near a 1:1 stoichiometric ratio. The doped group III-V metal nitrides and compositions thereof contain no more than $10^{18}$ cm-2 nitrogen vacancies and have a p-type conductivity concentration up to $10^{20}$ cm-3. For example, p-type doped AlGaN and AlN epilayers grown on substrates, including but not limited to SiC, GaN, AlN, sapphire (Al2O3), ZnO, or a refractory metal, will have an increase in p-type conductivity due to the reduction of nitrogen vacancies and other imperfections in the epilayers. In another example, AlN wafers having a defect density less than $10^6$ cm-2 can be produced by the slow HTHP annealing process.

In one aspect of the annealing process 100, a wafer boat containing a number of p-type doped group III-V metal nitride wafers is placed in the annealing vessel. The interior of the annealing vessel is evacuated to a vacuum pressure of $1\times10^{-9}$ torr, in order to purge ambient gas from the annealing vessel or any mobile gas trapped within the wafers. The annealing vessel is then filled with nitrogen gas to create an overpressure of approximately 7000 torr and heated to a temperature of approximately 2000° C. The wafers are annealed at constant temperature and pressure for approximately twenty-four hours to forty-eight hours to allow the nitrogen gas to enter into the wafers and thereby diffuse the nitrogen vacancies out of the wafers. In one embodiment, the wafers are then removed from the annealing vessel and allowed to cool.

In another embodiment, the wafers are cooled within the annealing vessel under the nitrogen overpressure. In yet another embodiment, the wafers are cooled under a nitrogen overpressure that is greater than the pressure used during the annealing process. The additional overpressure further promotes the reduction of the holes in the metal nitrides.

In another embodiment, the metal nitrides are rapidly quenched by being mechanically removed from the high temperature environment, while still in a nitrogen-rich environment.

While the invention has been explained in relation to exemplary aspects and embodiments, it is to be understood that various modifications thereof will become apparent to those skilled in the art upon reading the description. Therefore, it is to be understood that the invention disclosed herein is intended to cover such modifications as fall within the scope of the appended claims.

What is claimed is:

1. A process for forming metal nitrides having p-type conductivity ranging between about 0.0001 Ohm-cm to about 100 Ohm-cm, the process comprising:
   placing a post-growth metal nitride in an annealing vessel;
   evacuating ambient gas to provide a vacuum;
   adding an overpressure of nitrogen gas comprising a nitrogen species to the evacuated vessel, whereby the overpressure of nitrogen gas is at a pressure greater than atmospheric pressure;
   heating the metal nitride to a temperature sufficient to diffuse the nitrogen species into metal nitride; and,
   annealing the metal nitride for at least one hour to form an annealed metal nitride.

2. The process of claim 1, wherein the metal nitride is selected from the group consisting of a wafer, a boule, an epitaxial film, a wafer having at least one epitaxial layer deposited thereon.

3. The process of claim 1, wherein the metal nitride consists essentially of a group III-V metal nitride compound.

4. The process of claim 3, wherein the metal nitride is a selected from the group consisting of binary, ternary, and quaternary group III-V metal nitrides.

5. The process of claim 1, wherein the metal nitride is p-type doped AlN.

6. The process of claim 1, wherein the metal nitride is p-type doped Al-enriched AlGaN alloy.

7. The process of claim 6, wherein the group III-V metal nitride is of the form $A_x B_{1-x} N$, where A or B is a group-III element.

8. The process of claim 1, wherein the ambient gas is evacuated to provide a vacuum ranging from about atmospheric pressure to about $1 \times 10^{-9}$ torr.

9. The process of claim 1, wherein the overpressure nitrogen gas ranges from about atmospheric pressure to about $3.8 \times 10^8$ torr.

10. The process of claim 1, wherein the overpressure nitrogen gas ranges from between about 1400 torr to about 10100 torr.

11. The process of claim 1, wherein the overpressure of nitrogen gas is greater than about 3800 torr.

12. The process of claim 1, wherein the metal nitride is heated to a temperature ranging from about 1000° C. to about 2200° C.

13. The process of claim 1, wherein the metal nitride is annealed for between one hour and one hundred hours.

14. The process of claim 13, wherein the temperature of the metal nitride is constant throughout the process.

15. The process of claim 1, wherein the annealed metal nitride has a nitrogen vacancy density of less than $10^{18}$ cm$^{-2}$.

16. The process of claim 1, wherein the annealed group III-V metal nitride has a p-type conductivity concentration up to $10^{20}$ cm$^{-3}$.

17. A process to improve p-type conductivity of a post-growth group III-V metal nitrides by reducing nitrogen vacancies, the process comprising:
   heating the group III-V metal nitrides in an environment of nitrogen gas for at least one hour, the nitrogen gas forming an overpressure greater than atmospheric pressure.

18. A process to improve p-type conductivity of a post-growth group III-V metal nitride, the process comprising:
   heating the group III-V metal nitride to a temperature greater than 1000° C. in a nitrogen gas environment;
   pressurizing the nitrogen gas environment to at least 3800 torr; and,
   annealing the group III-V metal nitride for one to forty-eight hours to reduce the nitrogen vacancy density of the metal nitride.

19. A process to improve p-type conductivity of a post-growth group III-V metal nitride by reducing nitrogen vacancies, the process comprising:
   heating the group III-V metal nitride to a temperature of about 2000° C. in a nitrogen gas environment;
   pressurizing the nitrogen gas environment to about 7000 torr; and,
   annealing the group III-V metal nitride for at least twenty-four hours, to reduce the nitrogen vacancy density of the metal nitride and decrease resistivity of the metal nitride to between about 0.0001 Ohm-cm and about 100 Ohm-cm.

* * * * *

UNITED STATES PATENT AND TRADEMARK OFFICE
Certificate

Patent No. 8,399,367 B2                                                                                                   Patented: March 19, 2013

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Jason Schmitt, Wichita, KS (US); and Peng Lu, Wichita, KS (US).

Signed and Sealed this Thirty-first Day of December 2013.

*MATTHEW W. SUCH*
*Supervisory Patent Examiner*
*Art Unit 2896*
*Technology Center 2800*